(12) United States Patent
Hay et al.

(10) Patent No.: US 9,280,600 B2
(45) Date of Patent: Mar. 8, 2016

(54) METHOD AND SYSTEM FOR DECOMPRESSION-FREE INSPECTION OF SHARED DICTIONARY COMPRESSED TRAFFIC OVER HTTP

(71) Applicants: Yissum Research Development Company of The Hebrew University of Jerusalem Ltd., Jerusalem (IL); RAMOT AT TEL-AVIV UNIVERSITY LTD., Tel Aviv (IL); The Interdisciplinary Center, Herzliya (IL)

(72) Inventors: David Hay, Tel Aviv (IL); Yaron Koral, Hod Hasharon (IL); Anat Brembler-Barr, Ramat Hasharon (IL); Shimrit Tzur-David, Givat Yearim (IL)

( * ) Notice: Subject to any disclaimer, the term of this patent is extended or adjusted under 35 U.S.C. 154(b) by 190 days.

(21) Appl. No.: 13/847,758

(22) Filed: Mar. 20, 2013

(65) Prior Publication Data

US 2013/0254197 A1    Sep. 26, 2013

(51) Int. Cl.
*G06F 17/30* (2006.01)
*H04L 12/26* (2006.01)
*H03M 7/30* (2006.01)

(52) U.S. Cl.
CPC ....... *G06F 17/30861* (2013.01); *H03M 7/3084* (2013.01); *H04L 43/028* (2013.01)

(58) Field of Classification Search
CPC ... G06F 17/30864; G06Q 10/10; G06Q 30/02
USPC .......................................................... 707/736
See application file for complete search history.

(56) References Cited

U.S. PATENT DOCUMENTS

| | | | |
|---|---|---|---|
| 7,600,257 B2* | 10/2009 | Dubrovsky et al. | 726/23 |
| 2005/0273450 A1* | 12/2005 | McMillen et al. | 707/1 |
| 2006/0020595 A1* | 1/2006 | Norton et al. | 707/6 |
| 2007/0038798 A1* | 2/2007 | Bouchard et al. | 711/3 |
| 2013/0054836 A1* | 2/2013 | Levien et al. | 709/247 |
| 2013/0114626 A1* | 5/2013 | Bellessort et al. | 370/477 |

* cited by examiner

*Primary Examiner* — Scott A Waldron
*Assistant Examiner* — Dongming Wang
(74) *Attorney, Agent, or Firm* — Pearl Cohen Zedek Latzer Baratz LLP

(57) ABSTRACT

A system and a method for decompression-free inspection of compressed data are provided herein. The method includes the following stages: obtaining a dictionary file comprising a string of symbols, each associated with a respective index; obtaining at least one delta file associated with said dictionary file, wherein said delta file comprises a sequence of instructions that include at least one copy instruction pointing to an index within said dictionary and a length of a copy substring to be copied; scanning said dictionary using a pattern matching algorithm associated with a plurality of patterns and implemented as a Deterministic Finite Automaton (DFA), to yield DFA execution data; scanning said at least one delta file, using said pattern matching algorithm, wherein said DFA execution data is used to skip at least part of the scanning of the copy substrings for at least one of the copy instructions.

24 Claims, 6 Drawing Sheets

METHOD AND SYSTEM FOR DECOMPRESSION-FREE INSPECTION OF SHARED DICTIONARY COMPRESSED TRAFFIC OVER HTTP

CROSS-REFERENCE TO RELATED APPLICATIONS

This application claims the benefit of U.S. Provisional Patent Application No. 61/613,096, filed on Mar. 20, 2012 which is incorporated herein in its entirety.

FIELD OF THE INVENTION

The present invention relates generally to the field of computer network communication and in particular to systems and methods for inspecting the content of compressed data transferred over computer networks.

BACKGROUND OF THE INVENTION

Many networking devices inspect the content of packets for security hazards such as word signatures and balancing decisions. These devices reside between the server and the client and perform Deep Packet Inspection (DPI). Using DPI, a device can examine the payload (and possibly also the header) of a packet, searching for protocol non-compliance, viruses, spam, intrusions, or other predefined criteria to decide whether the packet can pass, if it needs to be dropped or be routed to a different destination.

One of the challenges in performing DPI is traffic compression. In order to save bandwidth and to speed up web browsing, most major sites use compression. Recent studies show that approximately 38% of the websites compress their traffic. When focusing on the top 1,000 sites, a remarkable 78% of the sites compress their traffic. As the majority of this information is dynamic, it does not lend itself to conventional caching technologies. Therefore, compression is a top issue in the Web community.

The first generation of compression is intra-file compression, i.e. the file has references to back addresses. Two very common compression methods of the first generation are Gzip and Deflate which have been both developed in the 90's and are very common in HTTP compression. Both methods use combination of the LZ77 algorithm and the Huffman coding. LZ77 Compression reduces the string presentation size by spotting repeated strings within a sliding window of the uncompressed data. The algorithm replaces the repeated strings by (distance, length) pair, where distance indicates the distance in bytes of the repeated string and length indicates the string's length. Huffman Coding receives the LZ77 symbols as input and reduces the symbol coding size by encoding frequent symbols with fewer bits. Gzip or Deflate work well as the compression for each individual response, but in many cases there is a lot of common data shared by a group of pages, namely inter-response redundancy. Therefore, compression methods of the next generation are inter-file, where there is one dictionary that can be referenced by several files. An example of a compression method that uses a shared dictionary is SDCH.

Shared Dictionary Compression over Hypertext Transfer Protocol (HTTP) (HTTP) (SDCH) was proposed by Google Inc, thus, Google Chrome (Google's browser) supports it by default. Android is a software stack for mobile devices that includes an operating system, middleware and key applications. SDCH code appears also in the Android platform and it is likely to be used in the near future. Therefore, a solution for pattern matching on shared dictionary compressed data is essential for this platform as well. SDCH is complement to Gzip or Deflate, i.e. it could be used before applying Gzip. On webpages containing Google search results, the data size reduction when adding SDCH compression before Gzip is about 40% better than Gzip alone.

The idea of the shared dictionary approach is to transmit the data that is common to each response once and after that send only the parts of the response that differ. In SDCH notations, the common data is called the dictionary and the differences are stored in a delta file. Specifically, a dictionary is composed of the data used by the compression algorithm, as well as metadata describing its scope and lifetime. The scope is specified by the domain and path attributes, thus, a user can download several dictionaries, even from the same server.

Multi-patterns matching on compressed traffic requires two time-consuming phases being traffic decompression and pattern matching. Currently, most security tools either do not scan compressed traffic, or they ensure that there will not be compressed traffic by re-writing the HTTP header between the original client and server. The first method harms security and may be the cause to miss-detection of malicious activity, while the second one harms the performance and bandwidth of both client and server. The few security tools that handle HTTP compressed traffic, first construct the full page by decompressing it, and then perform signatures scan. Since security tools should operate in the network speed, this option is usually not feasible.

String matching algorithm is an essential building block for numerous applications; therefore, it has been extensively studied. Some of the fundamental algorithms are Boyer-Moore, which solve the problem for a single pattern and Aho-Corasick and Wu-Manber for multi-patterns. The basic idea of the Boyer-Moore algorithm is that more information is gained by matching patterns from the right than from the left. This allows to heuristically reduce the number of the required comparisons. The Wu-Manber algorithm uses the same observation; however, it provides a solution for the multi-pattern matching problem. The Aho-Corasick algorithm builds a Deterministic Finite Automaton (DFA) or a Finite State Machine (FSM) based on the patterns. Thereafter, while scanning an input text, the DFA is processed in a single pass.

There are also several works that target the problem of pattern matching on Lempel-Ziv compressed data. Specifically, a solution for Gzip HTTP traffic, called ACCH, is known in the art. This solution utilizes the fact that the Gzip compression algorithm works by eliminating repetitions of strings using back-references (pointers) to the repeated strings. ACCH stores information produced by the pattern matching algorithm, for the already scanned uncompressed traffic, and then in case of pointers, it uses this data in order to determine if there is a possibility of finding a match or it can skip scanning this area. This solution shows that pattern matching on Gzip compressed HTTP traffic with the overhead of decompression is faster than performing pattern matching on regular traffic. A similar conclusion regards files (as opposed to traffic) is known in the art.

However, all these algorithms are geared for first-generation compression methods, while there is no pattern matching algorithms for inter-file compression schemes, such as the rapidly-spreading SDCH. It would be therefore advantageous to provide a method and a system that perform pattern matching on SDCH based traffic without decompression the compressed data first.

SUMMARY OF THE INVENTION

The present invention, in embodiments thereof, provides a pattern matching algorithm on SDCH. The suggested algorithm operates in two phases, an offline (or pre-computation) phase, and an online (or computation) phase. The offline phase starts when the network device gets the dictionary. In this phase the algorithm uses Aho-Corasick pattern matching algorithm to scan the dictionary for patterns and marks auxiliary information to facilitate the scan of the delta files. Upon receiving the delta file, it is scanned online using Aho-Corasick algorithm. Since the delta file eliminates repetitions of strings using references to the common strings in the dictionary, our algorithm tries to skip these reference, so each plain-text byte is scanned only once (either in the offline or the online phases). Embodiments of the present invention are able to skip up to 99% of the referenced data and gain up to 56% improvement in the performance of the multi-patterns matching algorithm, compared with scanning the plain-text directly.

Embodiments of the present invention address the problem of pattern matching algorithm for shared dictionary compressed traffic. As mentioned, the spread of this approach increases rapidly, thus, a dedicated solution is essential. In addition, a novel algorithm that scans only a negligible amount of bytes more than once has been designed. This is a remarkable result considering the fact that bytes in the dictionary can be referenced multiple times by different positions in one delta file and moreover, by different delta files. SDCH compression ratio is about 44%, implying that 56% of the data is copied from the dictionary. Thus, the suggested single scan implies that the proposed algorithm achieves 56% improvement in performance compared to scanning the plain-text file.

Advantageously, embodiments of the proposed algorithm are associated with low memory consumption. The proposed algorithm stores only the dictionary being used (along with some auxiliary information per dictionary). In the case of SDCH, since it was developed for web traffic, one dictionary usually supports many connections. In other words, the memory consumption depends on the number of the dictionaries and their sizes and not in the number of connections, which is the case in intra-file compression methods.

Finally, an important contribution is a mechanism to deal with matching regular-expression signatures in SDCH-compressed traffic. Regular expression signatures gain an increasing popularity due to their superior expressibility. It will be shown how to use the proposed algorithm as a building block for regular expression matching. Experiments carried out by the inventors show that the proposed regular expression matching mechanism gains a similar 56% boost in performance.

These additional, and/or other aspects and/or advantages of the present invention are set forth in the detailed description which follows.

BRIEF DESCRIPTION OF THE DRAWINGS

For a better understanding of the invention and in order to show how it may be implemented, references are made, purely by way of example, to the accompanying drawings in which like numerals designate corresponding elements or sections. In the accompanying drawings.

Figure 1:
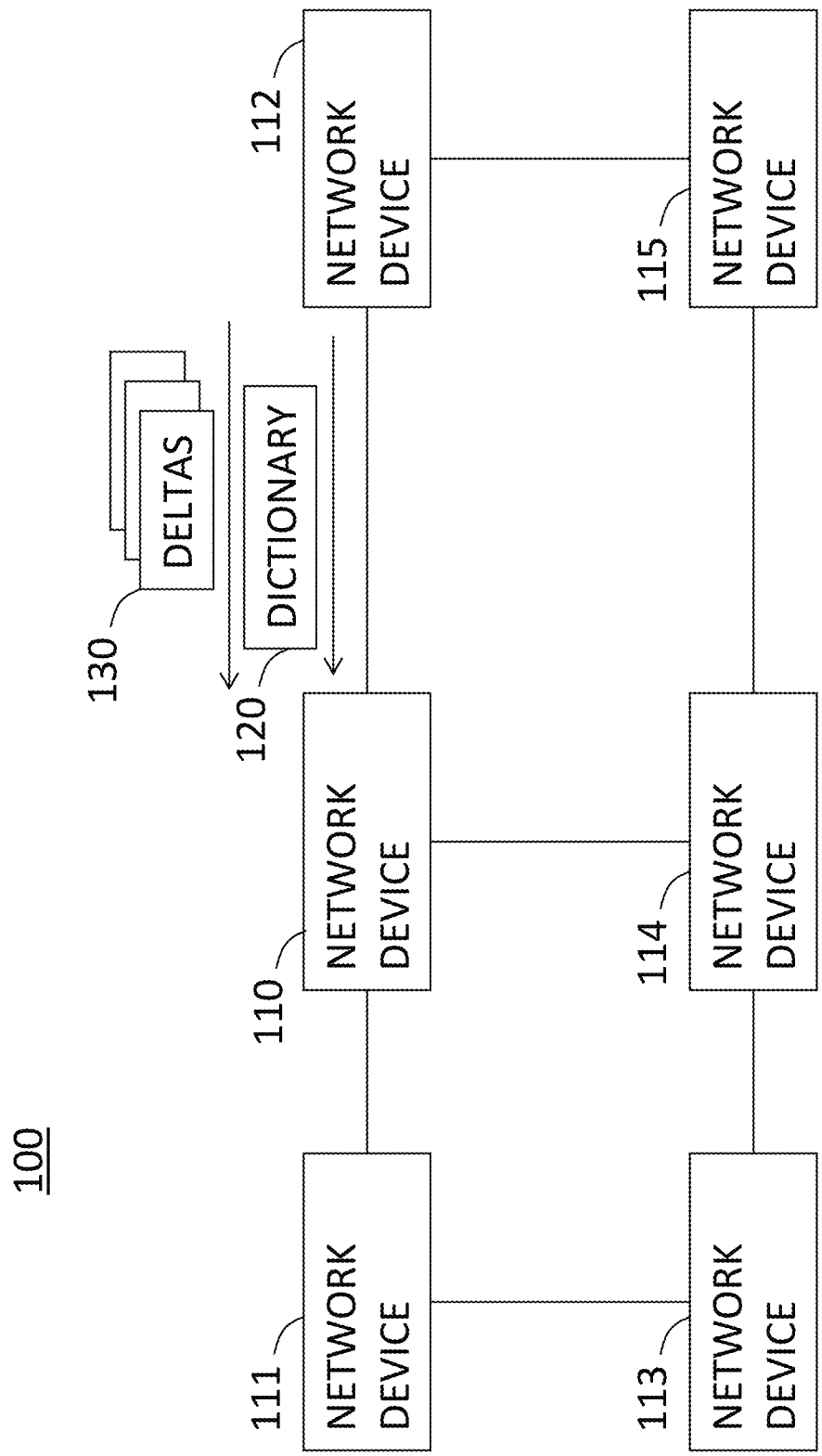
FIG. 1 is a high level block diagram illustrating a system according to some embodiments of the present invention.

The drawings together with the following detailed description make the embodiments of the invention apparent to those skilled in the art.

DETAILED DESCRIPTION OF THE INVENTION

With specific reference now to the drawings in detail, it is stressed that the particulars shown are for the purpose of example and solely for discussing the preferred embodiments of the present invention, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Before explaining the embodiments of the invention in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

FIG. 1 is a high level block diagram illustrating a system according to some embodiments of the present invention. The system includes a plurality of network devices 110-116 connected to each other over a communication network 100 such as the Internet. Within communication network 100, at least one of the network devices, e.g., 100 may be, further to being a communication node, configured to: obtain a dictionary file 120 comprising a string of symbols, each associated with a respective index; obtain at least one delta file 130 associated with said dictionary file 120, wherein said delta file 130 comprises a sequence of instructions that include at least one copy instruction pointing to an index within said dictionary 120 and a length of a copy substring to be copied; scan said dictionary 120 using a pattern matching algorithm associated with a plurality of patterns and implemented as a Deterministic Finite Automaton (DFA), to yield DFA execution data; and scan said at least one delta file 130, using said pattern matching algorithm, wherein said DFA execution data is used to skip at least part of the scanning of the copy substrings for at least some of the copy instructions.

Figure 2:
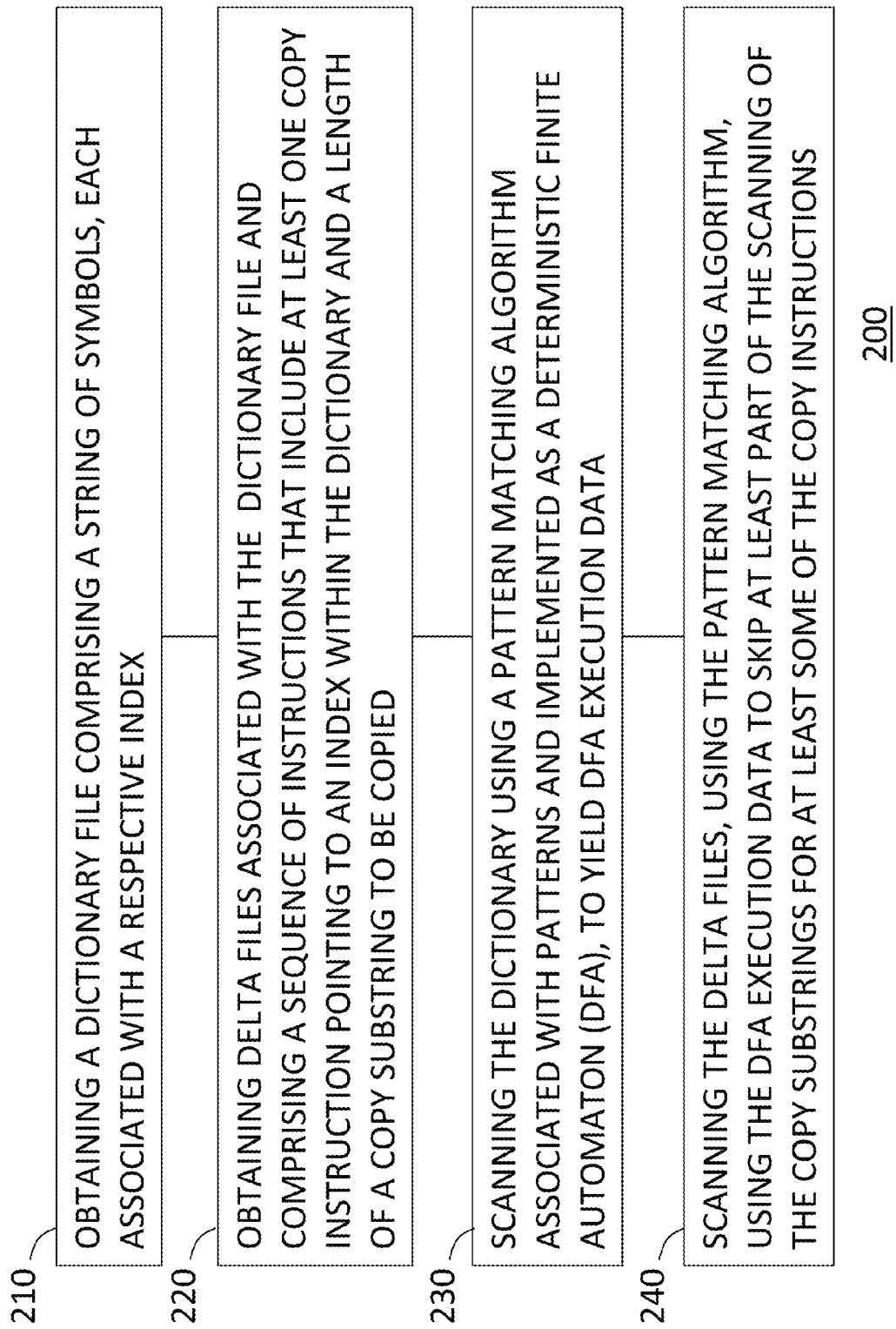
FIG. 2 is a high level flowchart diagram illustrating a method according to embodiments of the present invention.

FIG. 2 is a high level flowchart diagram illustrating a method 200 according to embodiments of the present invention. It is understood that method 200 is not necessarily limited to the aforementioned architecture of computer network 100 but may be carried out by similar networks. Method 200 includes the following stages: obtaining a dictionary file comprising a string of symbols, each associated with a respective index 210; obtaining at least one delta file associated with said dictionary file, wherein said delta file comprises a sequence of instructions that include at least one copy instruction pointing to an index within said dictionary and a length of a copy substring to be copied 220; scanning said dictionary using a pattern matching algorithm associated with a plurality of patterns and implemented as a Deterministic Finite Automaton (DFA), to yield DFA execution data 230; and scanning said at least one delta file, using said pattern matching algorithm, wherein said DFA execution data is used to skip at least part of the scanning of the copy substrings for at least one of the copy instructions 240.

Following is a more detailed description of the aforementioned architecture and logic of embodiments of the present invention. Specifically. Embodiments of the present invention are presented herein in the context of currently available SDCH mechanism but it should be understood that the present invention should not be limited to SDCH only.

SDCH is a new compression mechanism proposed by Google Inc. In SDCH, a dictionary is downloaded (as a file) by the user agent from the server. The dictionary contains strings which are likely to appear in subsequent HTTP responses. If, for example, the header, footer, JavaScript and CSS are stored in a dictionary possessed by both user agent and server, the server can construct a delta file by substituting these elements with references to the dictionary, and the user agent can reconstruct the original page from the delta file using these references. By substituting dictionary references for repeated elements in HTTP responses, the payload size is reduced and the cross-payload redundancy can be saved. In order to use SDCH, the user agent adds the label SDCH in the Accept-Encoding field of the HTTP header. The scope of a dictionary is specified by the domain and path attributes, thus, one server may have several dictionaries and the user agent has to have a specific dictionary in order to decompress the server's compressed traffic. If the user agent already has a dictionary from the negotiated server, it adds the dictionary id as a value to the header Avail-Dictionary. If the user agent does not have the specific dictionary that was used by the server, the server sends an HTTP response with the header Get-Dictionary and the dictionary path; now, the user agent can construct a request to get the dictionary.

It should be noted that the proposed pattern matching can run in a different machine than the server and the client (e.g., in a security tool that operates as a proxy between them). Since the proposed algorithm needs the correct dictionary, it can force the server to send a response with the Get-Dictionary header by deleting the Avail-Dictionary field in the client's request.

SDCH encoding is built upon the VCDIFF compression data format. VCDIFF encoding process uses three types of instructions, called delta instructions: ADD, RUN and COPY. ADD(i, str) means to append to the output i bytes, which are specified in parameter str. RUN(i, b) means to append i times the byte b. Finally, COPY(p,x) means that the interval [p, p+x)] should be copied from the dictionary (that is, x bytes starting at position p). The delta file contains the list of instructions with their arguments and the dictionary is one long string composed of the characters that can be referenced by the COPY instructions in the delta file. In the reminder of the disclosure, the RUN instruction is ignored since it is barely used and can be replaced with an equivalent ADD for these purposes.

For example, suppose that the dictionary is DBEAACDB-CABC, and the delta file is given in table (1) by the following commands:

TABLE (1)

1. ADD (3, ABD)
2. COPY (0, 5)
3. ADD (1, A)
4. COPY (4, 5)
5. ADD (2, AB)
6. COPY (9, 3)
7. ADD (4, AACB)

TABLE (1)-continued

8. COPY (5, 3)
9. ADD (1, A)
10. COPY (6, 3)

Therefore, the plain-text that should be considered is therefore (bolded bytes were copied from the dictionary):
ABDDBEAAAACDBCABABCAACBCDBADBC Any networking device that is based on DPI uses some sort of a pattern matching algorithm. One of the fundamental approaches is the Aho-Corasick algorithm, which the proposed algorithm uses. The Aho-Corasick algorithm matches multiple patterns simultaneously, by first constructing a Deterministic Finite Automaton (DFA) representing the patterns set, and then, with this DFA on its disposal, processing the text in a single pass.

Specifically, the DFA construction is done in two phases. First, the algorithm builds a trie of the pattern set: All the patterns are added from the root as chains, where each state corresponds to one symbol. When patterns share a common prefix, they also share the corresponding set of states in the trie. The edges of the first phase are called forward transitions. In the second phase, failure transitions are added to the trie. These edges deal with situations where, given an input symbol b and a state s, there is no forward transition from s using b. In such a case, the DFA should follow the failure transition to some state s' and take a forward transition from there. This process is repeated until a forward transition is found or until the root is reached, leading to possible failure paths.

Figure 3:
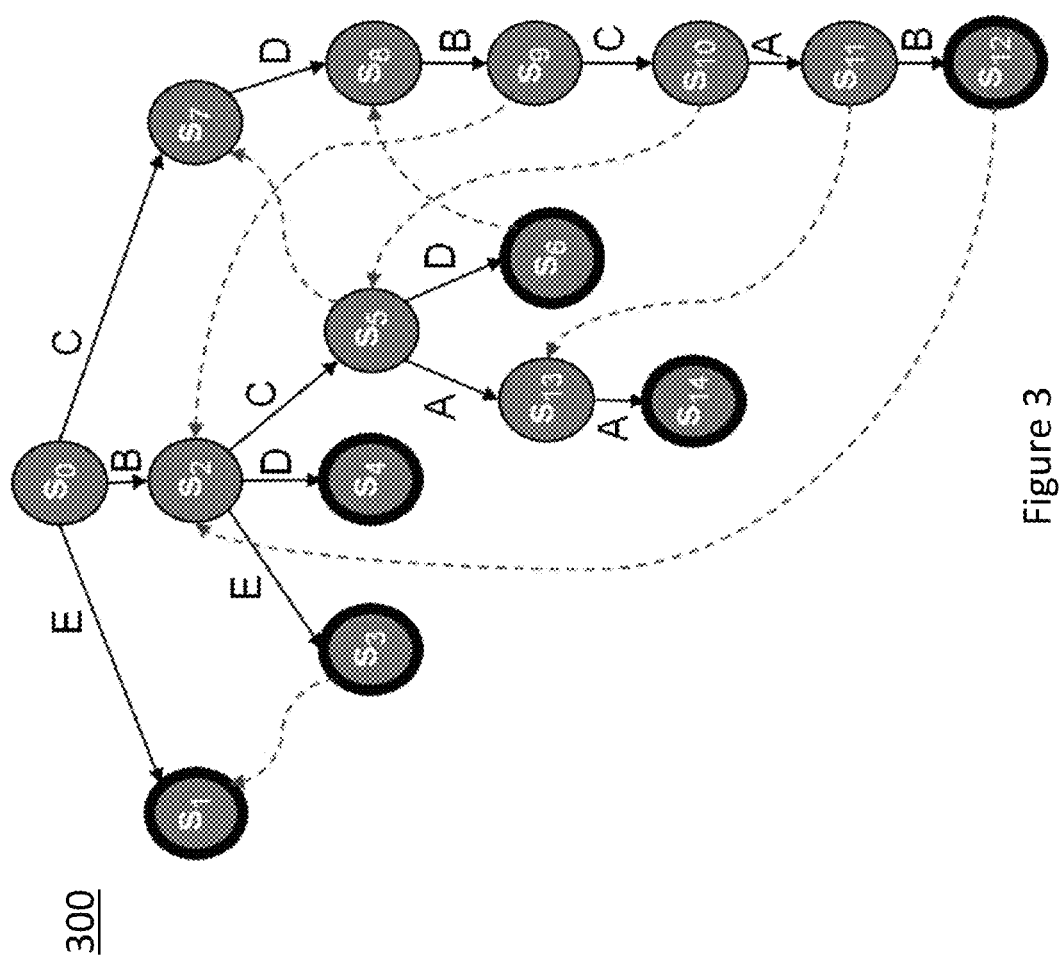
FIG. 3 is a state diagram illustrating an aspect according to embodiments of the present invention.
Figure 4:
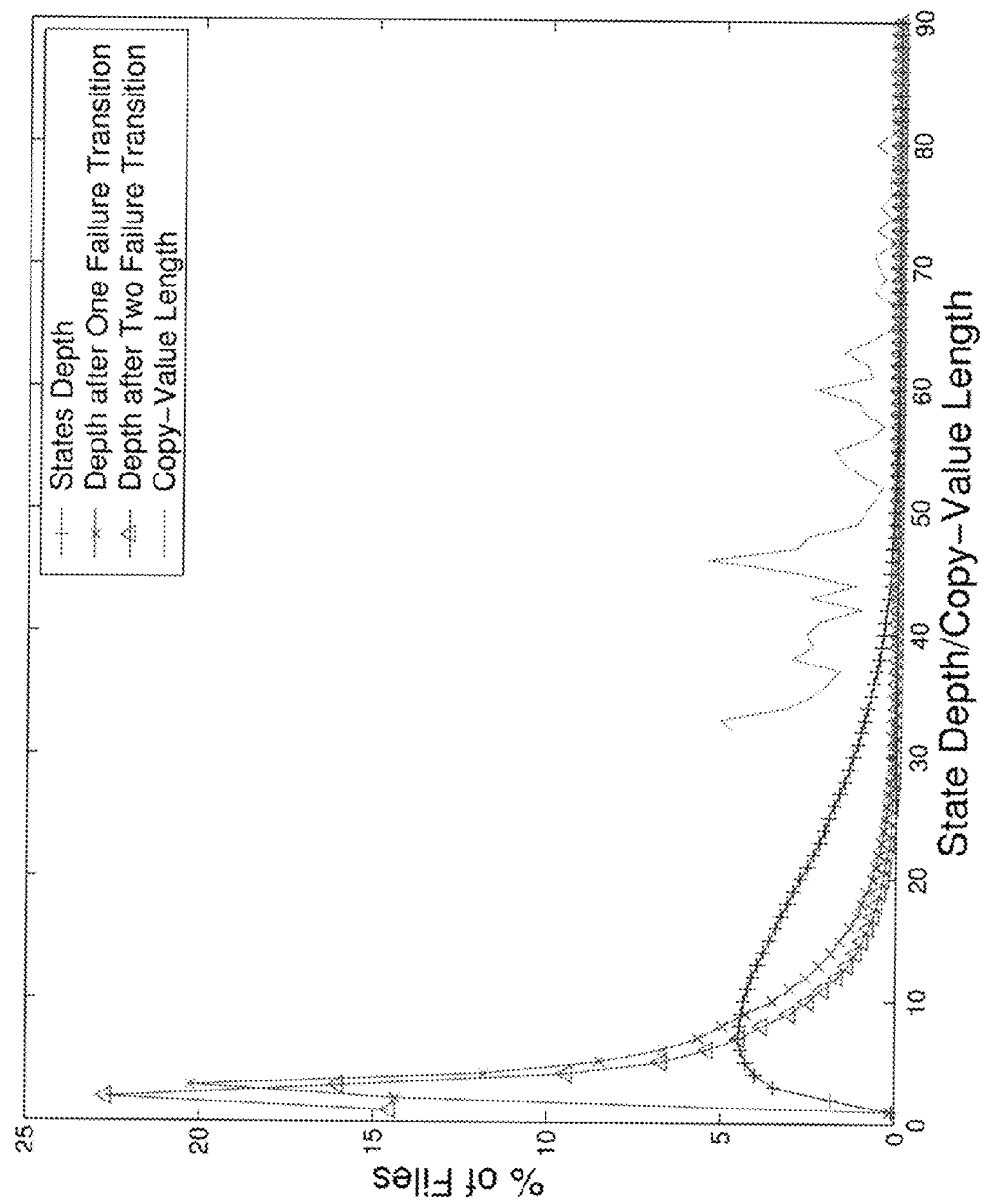
FIG. 4 is a graph diagram illustrating an aspect according to some embodiments of the present invention.

FIG. 3 is a state diagram illustrating an aspect according to embodiments of the present invention. The illustrated non limiting exemplary DFA 300 was constructed for patterns set {E,BE,BD,BCD,BCAA,CDBCAB}. Solid black edges represent forward transitions while scattered edges represent failure transitions. Let the label of a state s, denoted by L(s), be the concatenation of symbols along the path from the root to s. Furthermore, let the depth of a state s be the length of the label L(s). The failure transition from s is always to a state s', whose label L(s') is the longest suffix of L(s) among all other DFA states. This implies the following property of the Aho-Corasick DFA:

Property 1

If L(s') is a suffix of L(s) then there is a failure path (namely, a path comprised only of failure transitions) from state s to state s'.

The DFA is traversed starting from root. When the traversal goes through an accepting state, it indicates that some patterns are a suffix of the input; one of these patterns always corresponds to the label of the accepting state. Formally, s.out put denotes the set of patterns matched by state s; if s is not an accepting state then s.out put=0. Finally, scans, b) denotes the AC procedure when reading input symbol b while in state s; namely, transiting to a new state s after traversing failure transitions and a forward transition as necessary, and reporting matched patterns in case S'.output=0. scan(s, b) returns the new state s' as an output. The correctness of the AC algorithm essentially stems from the following simple property:

Property 2

Let $b_1, \ldots b_n$ be the input, and let $s_1 \ldots s_n$ be the sequence of states the AC algorithm goes through, after scanning the symbols one by one (starting from the root of the DFA). For any i G $\{0, \ldots n\}$, L(si) is a suffix of $b_1, \ldots, bt$; furthermore, it is the longest such suffix among all other states of the DFA.

A non limiting motivating example is used herein to demonstrate insight of embodiments of the proposed algorithm. It is assumed that the patterns set is {E,BE,BD,BCD,BCAA, CDBCAB}, whose corresponding Aho-Corasick automaton is depicted in FIG. 3. In addition, it is assumed that the same dictionary and delta file as in the example of table (1). The plain-text that should be considered is: ABDDBEAAA ACDBCABABCAACBCDBADBC, where symbols copied from the dictionary are marked in bold, and in underline patterns that should be matched.

Four kinds of matches are noticed: (1) Patterns that are fully contained within an ADD instruction. For example, the pattern BD is fully contained within the first instruction; (2) Patterns that are fully contained within a COPY instruction. For example, the pattern BE is fully contained within the second instruction; (3) Patterns whose prefix is within a COPY instruction. For example, the prefix of the pattern CDBCAB is within the fourth instruction; and (4) Patterns whose suffix is within a COPY instruction. For example, the suffix of the pattern BCD is within the eighth instruction.

It is noticed that there might be pattern which fall both in the third and in the fourth category (that is, their prefix is within one copy instruction, and their suffix is within another COPY instruction). Embodiments of the proposed algorithm work in two phases. First, the dictionary is preprocessed. Since the dictionary is common to many delta files, this phase runs offline. Then, the delta file is processed online. Following is a detailed description of both stages in light of the motivating example.

In the offline phase, the dictionary is scanned from the first symbol using the Aho-Corasick algorithm. For each symbol of the dictionary the state in which the algorithm is stored was while scanning that symbol. In addition, an ordered list of indices in which a match was found is being kept. It will be shown later that this information is sufficient to skip almost all the symbols of copy instructions in the delta file. Essentially, this follows from the fact that any scan that starts in the middle of the dictionary will reach states whose labels are suffixes of the states that are stored (Property 2). This, in turn, implies that there is a failure path between the states that are stored to the corresponding states had the scan was started in the middle of the dictionary (Property 1).

The results of the scan on the above-mentioned example are as follow in the following table (2):

TABLE (2)

| (0) D | (1) B | (2) E | ($^3$) A | ($^4$) A | ($^5$) C | (6) D | (7) B | (8) C |
|---|---|---|---|---|---|---|---|---|
| s0 | S2 | S3 | s0 | s0 | s7 | S8 | s9 | s10 |
| | | ($^9$) A | | (10) B | | (11) C | | |
| | | s11 | | S12 | | s5 | | |

State[j] denotes the state corresponding to the j-th symbol of the dictionary. If the scan reaches an accepting state (that is, a pattern was found within the dictionary), it is saved in a list called Matched. In that list, the index of the last symbol of the matched pattern is stored along with the pattern itself (or, equivalently, a pointer to the pattern). The list is sorted by the index of the symbol. In our example, there are two matches, implying that Matched=[(2, {E, BE}), (10, {CDBCAB})].

The Online Phase: In the online phase the delta file is being scanned using the Aho-Corasick algorithm. Since the data in the ADD instruction is new (that is, it was not scanned in the offline phase), it is simply scanned by traversing the automaton.

When encountering a COPY (x,p) instruction, which copies the symbols $b_p, \ldots, b_{p+x-1}$ from the dictionary, the following three steps are being carrying out:

Step 1:

Scan the copied symbols from the dictionary one by one, until when scanning a symbol $b_{p+i}$ a state in the automaton is reached whose depth is less or equal to As shall be proved later, this scan ensures finding all patterns whose suffix is within this COPY instruction (the fourth category of patterns). It should be noticed that the depth of a state essentially indicates the length of meaningful suffix of the input when reaching this state. Therefore, if a state whose depth is less than the number of copied symbols scanned so far is reached, any pattern that ends within the COPY instruction is fully contained in it (the second category). If the end of the copied data (that is, symbol $b_{p+x}-1$) is reached before encountering such a small depth state, the next instruction is applied as all the copied symbol were scanned. Otherwise, the next steps are carried out.

Step 2:

The Matched list is checked to find any patterns in the dictionary that ends within interval [x, x+p). If such patterns are found, it is checked by their length that they are indeed fully contained within that interval. Hence, it is ensured to find all the patterns of the second category. Step 3: The state State[p+x−1] is obtained; namely, the state corresponding to the last copied symbol. From that state, failure transitions are followed in the automaton, until a state s whose depth is less or equal to x is reached. (Since all failure paths in the automaton end in the root whose depth is 0, an eventual stop is guaranteed). Properties 1 and 2 yield that L(s) is the longest suffix of $b_p, \ldots, b_{p+x-1}$ (among all states' labels). Since Step 1 dealt with all patterns that begin before $b_p$, the meaningful suffix of the input starts after $b_p$. This implies that the Aho-Corasick algorithm would have been also in state s, had it scanned all the symbols $b_p, \ldots, b_{p+x-1}$ one by one. Therefore, when processing the next instructions the algorithm behaves exactly the same, guaranteeing to find all patterns of the third category. In addition, this implies identical scans also on ADD instructions, therefore guaranteeing to find all patterns of the first category.

Table (3) below shows a step-by-step execution of our algorithm on the above mentioned delta file.

TABLE 3

| 1 | ADD (3,ABD) | A  B  D<br>S0 --> s0 --> S2 --> S4<br>Report pattern BD (by state s4) |
|---|---|---|
| 2 | COPY (0,5) | $s_4 \xrightarrow{D} s_0$. Stop scanning copied bytes (depth($s_0$) ≤ 1).<br>Check Matched for indices [0,5). Report patterns E, BE (from Matched list).<br>Go to State[4] = $s_0$, depth($s_0$) ≤ 5. |
| 3 | ADD (1,A) | A<br>s0 --> s0 |
| 4 | COPY (4,5) | No scanning of copied bytes (depth($s_0$) ≤ 0).<br>Check Matched for indices [4,9).<br>Go to State [8] = s10. depth($s_{10}$) = 4 ≤ 5. |
| 5 | ADD (2,AB) | A  B<br>s10--> s11--> s12<br>Report pattern CDBCAB (by state s12) |
| 6 | COPY (9,3) | A<br>s12→S0. Stop scanning copied bytes (depth($s_0$) ≤ 1).<br>Check Matched for indices [9,12). Match was found, but does not fit the interval.<br>Go to State[11] = $s_5$. depth($s_5$) = 2 ≤ 3. |

TABLE 3-continued

| 7. ADD (4,AACB) | $S5 \xrightarrow{A} s13 \xrightarrow{A} s14$.<br>Report pattern BCAA (by state s14) s14 →s7 →s2. |
| --- | --- |
| 8. COPY (5,3) | $S2 \xrightarrow{C} S5 \xrightarrow{D} s6$<br>Report pattern BCD (by state s6)<br>B<br>s6 ---> s9 (reached end of instruction) |
| 9. ADD (1,A) | A<br>s9 --> s0 |
| 10. COPY (6,3) | No scanning of copied bytes (depth($s_0$) ≤ 0).<br>Check Matched for indices [6,9).<br>Go to State[8] = s10, depth($s_{10}$) = 4 > 3.<br>$s10^{failure} \longrightarrow_s 5$. depth(s5) = 2≤3. |

As shown above, the algorithm reports the same matched patterns, and reaches the same state (s5) as if it scanned the plain-text. However, the algorithm skips most of the symbols (14 out of 19) within the COPY instructions.

Following are several optimizations to the aforementioned basic algorithm, carried out to enhance its online running time. These optimizations trade running time with modest memory increase.

Efficient pattern lookups in the Matched list: Let n be the length of the Matched list. The pattern lookups in the Matched list is performed runs in O(n). A common way to reduce this running time is to save the Matched list as a balanced tree or as a skip list. In such a case, the running time to find the first index which is larger than the copied address is only O(log n); then, the elements of Matched are checked one by one until the first element with index outsize the copied data is encountered. Another option, that trades memory with time, is to add an array of pointers, denoted by MatchedPointers, of the dictionary size (that is, with the same size as the State array). Element MatchedPointers[i] contains a pointer to an element (x, P) belongs to Matched such that x is the smallest index that is greater or equal to i. This data structure reduces the running time to find the first index which is larger than the copied address to O(1) (a single lookup in the MatchedPointers array).

Alternatively, given a copy (x, p) instruction, one can cache the corresponding internal matches within [p, p+x−1] in a hash-table whose key is "(x, p)". In such a case, when the exact copy appears again, one can obtain all the matches in a single access to that hash-table. Since the dictionary usually contains common phrases (e.g., HTML commands) that are used again and again, our experiments show that such a cache is extremely efficient. Specifically, during a search on 100 delta files with the same dictionary, the portion of cache hits rises very fast and becomes almost 100%. After a sharp learning curve, the average cache hits on the last 90 files was 99.4% and the average on the last 50 files was 99.7%.

Eliminating the traversal of failures paths: Failure path traversal is done at the end of the COPY instruction processing. It is noticed that the failure paths depends only on the state saved, thus one can perform the failure path traversal in the offline phase and save the entire path in the State array. For example, State[8] of the aforementioned example, which contains the state $s_{10}$ can be replaced by the entire failure path starting at $s_{10}$: ($s_{10},s_5,s_7,s_0$). Furthermore, this path can be saved in a tree-based structure according to the depth of the different states. Thus, in order to find the appropriate state, one should only perform a logarithmic (in the failure path length) number of operations.

In practice, failure path traversals impose almost no overhead on the running time of the online phase. SDCH delta file are usually compressed by Gzip to decrease its size even further. In such a case, the client needs to first decompress (using Gzip) the file and then to decompress it using the dictionary to get the plain-text. Embodiments of the present invention require that the compressed traffic has to be unzipped first; then, instead of decompress the SDCH compression, the resulting delta file is passed to the suggested algorithm.

It is noted that that Gzip decompression is a cheap operation compared to pattern matching. Furthermore, as mentioned above, SDCH compression ratio is around 44%, i.e. 56% of the data is copied from the dictionary. This numbers imply that even if the algorithm has to unzip the delta file before it scans it, the performance is stilled improved by around 56%.

Regular expressions become an integral part of patterns that are used for security purposes. In Snort, an open source network intrusion prevention and detection system, 55% of the rules contain regular expression. Each regular expression pattern contains one or more string tokens along with one or more regular expression tokens. For example the regular expression \d{6}ABCDE\s+123456\d*XYZ$ has the string tokens ABCDE, 123456, XYZ, and the regular expression tokens \d{6}, \s+ and \d*.

Like Snort, it is suggested to treat the string tokens as anchors and insert them to the DFA. Only when all the anchors of a single regular expression pattern are matched, the regular expression tokens are examined (e.g., using a regular expressions engine). Furthermore, in most cases, it is possible to limit the pattern search in at least one direction; namely, if before the first (resp., after the last) anchor, all tokens have a limited size (i.e., do not contain '+' or '*'), there is a bounded number of characters that should be examined before (resp., after) the matched position of the anchor. In the above example, if the anchor ABCDE is matched at position $x_1$ and the anchor XYZ at position $x_2$, the left bound, $l_{bound}$ is x1-10 and the right bound $r_{bound}$ is x2 Thus, the interval [$x_1$-10,$x_2$] should be passed to the regular expressions engine for re-examination. It is noted that $l_{bound}$ can be 0 and $r_{bound}$ can be the size of the file if there is an unlimited length token before the first anchor or after the last anchor.

To conclude, the suggested regular expression inspection works as follows: First, constant strings (a.k.a anchors) are extracted from the regular expression offline. Then, the suggested algorithm is applied on the SDCH-compressed traffic with the anchors as the patterns set. The anchors have to be matched in the same order of there appearances in the pattern. All the possible $l_{bound}$ values are saved (derived by the matched positions of the first anchor) and the maximal value of $r_{bound}$. Finally, there is a check performed whether there is a regular expression which all its anchors were matched. If there is, for each $l_{bound}$ value, an off-the-shelf regular expression engine is run from this value until, either character that yields a mismatch is scanned, or a full pattern match is obtained. In most of the cases, scanning a few bytes for each $l_{bound}$ value is performed, and the total number of scanned bytes in the interval is significantly less than its size. It is noted that since the anchors are matched at the correct order, the last scan is guaranteed to end before $r_{bound}$.

Data Sets:

Nowadays, Google's servers are the most prominent web servers that use shared dictionary compressed traffic. Furthermore, Google search is a fertile ground for popups, banners or any objectionable content. Thus, the suggested algorithm is evaluated with Google search result files. First the dictionary was downloaded from google.com and used the 1000 most popular Google search queries (for each such query, an HTTP request was constructed and got a SDCH-compressed webpage, which was used as an input file).

The signatures data sets are drawn from a snapshot of Snort rules as of October 2010. It is noted that shared dictionary compressed traffic is mainly used on the traffic from the server side to the client side, which is not the case supported by most of the underlying rules within Snort. Still, in order to perform experiments using regular expressions all Pert Compatible Regular Expressions (PCREs) were extracted from rules matching two header groups differing in the destination port (any and $HTTP_PORTS) There are 40 rules from the former group and 423 rules from the latter.

Since the input files do not contain many matches, specifically long matches are rare, a synthetic patterns file, was constructed for each input file in the following manner: the length distribution of Snort's patterns was calculated and then lengths from this distribution were randomly pick. For each length value I, a sequence of I characters was taken from the uncompressed version of the input file and add them as a pattern to the patterns file for the specific input file. It is stopped when the total length of the selected patterns is equal to the input file size. As a result, 1000 input files are present, each with its own patterns file, such that each pattern in that file has at least one match in the corresponding input file. This case is referred herein as the synthetic case.

Time Reduction:

The execution time of the algorithm has been compared to an execution time of a naive algorithm that first decompresses the file and then applies the Aho-Corasick algorithm on the plain-text. The experiments show a significant improvement: on average, the execution time of our algorithm is only 34% of the time it takes the naive algorithm to complete. It is important to note that some components of the naive implementation are done using off-the-shelf software. Hence, it was chosen to take the following conservative approach in estimating the time reduction; our approach ignores completely the decompression stage of the naive implementation and therefore it underestimates our performance gain.

It should be noticed that the proposed algorithm's run time depends on the number of scanned bytes and the failure transitions it. Thus, it is the main figure of interest is the ratio between the number of the bytes the proposed algorithm scans and these failure transitions, in addition to the size of the plain text (scanned by the naive algorithm) as given in formula (1) below:

$$\text{scan-ratio} = \frac{\text{scanned bytes} + \text{failure transitions taken}}{\text{size of the plain text}} \quad (1)$$

It should be noted that the different bytes of the plain-text can be classified by the type of their corresponding SDCH instruction. Let \add\ be the number of bytes generated by either ADD or RUN instruction (the number of bytes generated by a RUN instruction is negligible) and \copy\ be the number of bytes generated by a COPY instruction. Furthermore, $|copy_{scanned}|$ denotes the number of bytes generated by a COPY instruction and scanned by our algorithm (that is, in Line 14). Thus, formula (1) can be rewritten as formula (2):

$$\text{scan-ratio} = \frac{|add| + |copy_{scanned}| + \text{failure transitions taken}}{|add| + |copy|} \quad (2)$$

The scan-ratio is compared with the compression-ratio |add|/|add|+|copy|); namely, the fraction of bytes that were generated using ADD instructions compared to the total number of bytes (or equivalently, the ratio between the size of the compressed text and the plain text).

It is noted that the best achievable scan-ratio is equal to the compression-ratio (when $|copy_{scanned}|=0$). Furthermore, the better the compression-ratio, the better the scan-ratio is, because more bytes are copied and therefore, potentially, less bytes should be scanned.

Figure 5:
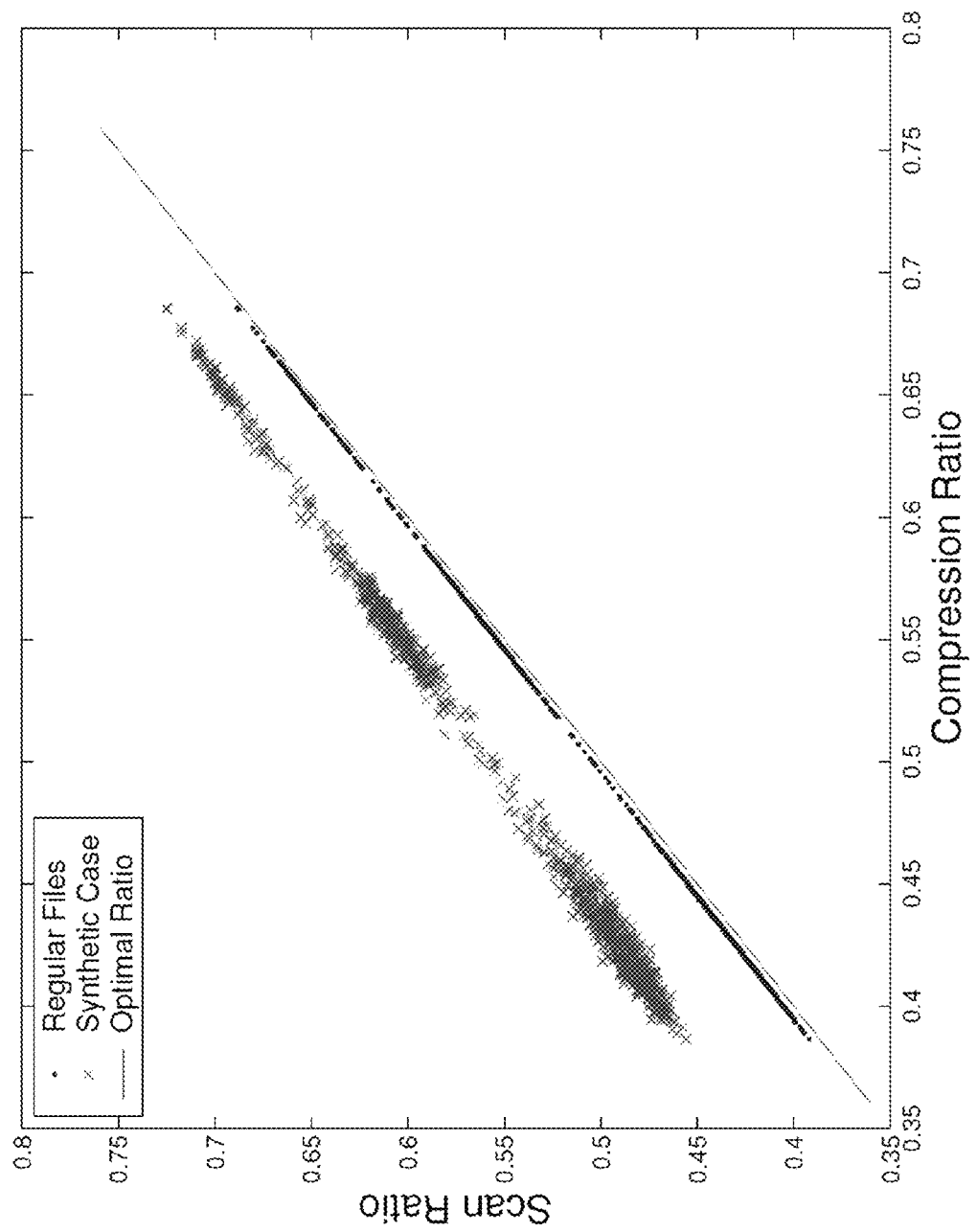
FIG. 5 is a graph diagram illustrating another aspect according to some embodiments of the present invention.

FIG. 5 is a graph diagram illustrating this exact relation for the input files with Snort's patterns and for the input files in the synthetic case. With Snort's patterns, the input files do not contain long patterns so the algorithm does not reach states with high depth. In the synthetic case, the input files contain patterns of all lengths and the algorithm reaches states with high depth. In this case, the algorithm has to scan several bytes until the number of scanned bytes is equal or greater than the depth of the current state. Thus, for the synthetic case, the scan-ratio is between 1.05 to 1.2 times the compression-ratio, and it depends on the compression-ratio value. To conclude, these figures imply that almost optimal time reduction was achieved, which equals to the compression ratio.

In order to evaluate the scan ratio with the regular expression patterns, it is required to calculate the number of extra bytes the algorithm scans when it matches all the anchors of such a pattern. Since matches are in general infrequent, the regular expression engine is not executed often (on average, only 5 executions per file have occurred). Furthermore, even when all the anchors are matched, the engine will not have scan more than a few bytes. Let $regexp_{scan}$ be the bytes that are scanned by the regular expression engine. The scan ratio from formula (1) is redefined to include these characters by adding $regexp_{scan}$ to its numerator.

Figure 6:
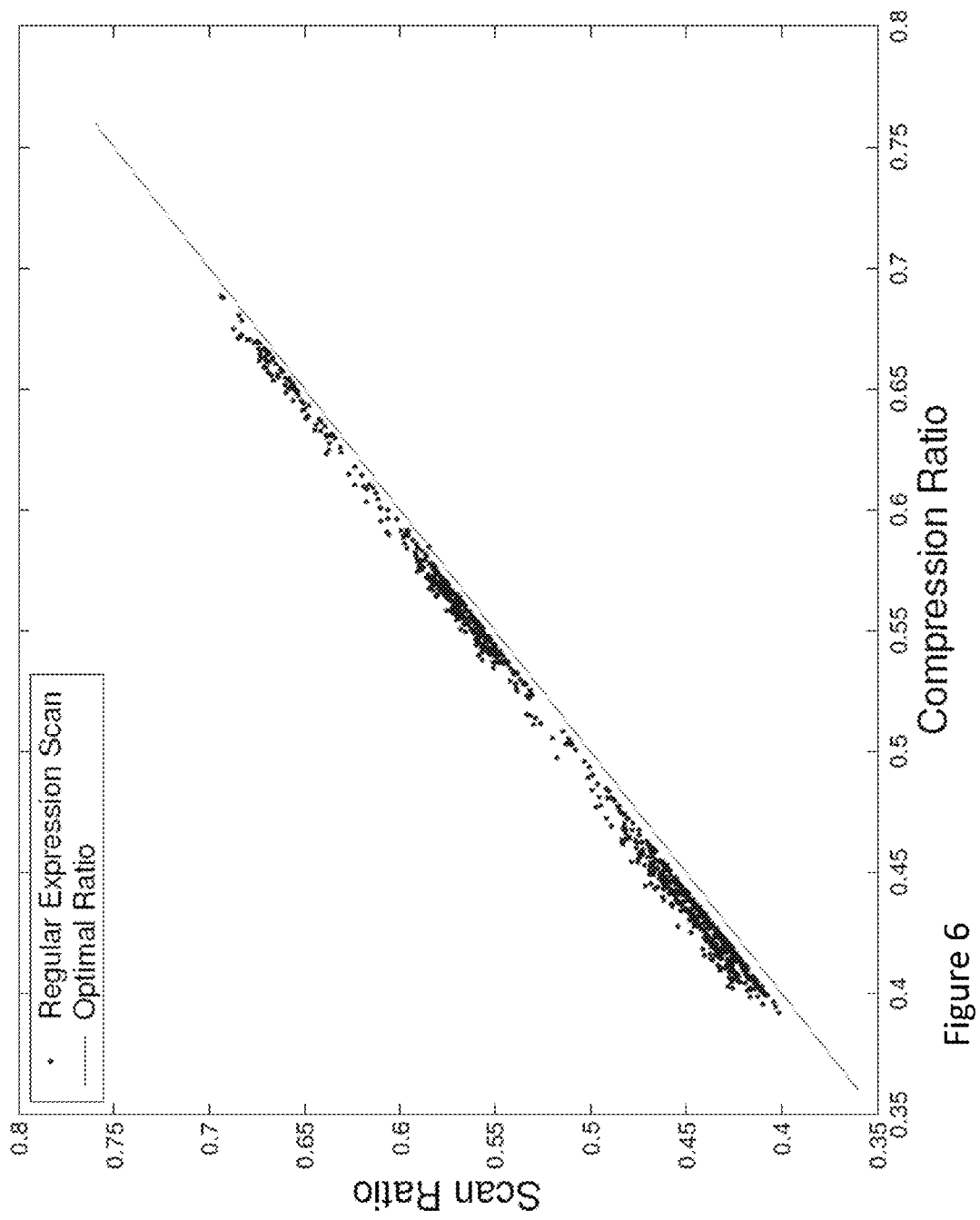
FIG. 6 is a graph diagram illustrating yet another aspect according to some embodiments of the present invention.

FIG. 6 is a graph diagram illustrating the relation between the compression ratio to the redefined scan ratio. On average, the overhead of the regular expression is around 1% which is almost negligible; the scan-ratio stays remarkably close to the optimal value. Note that the minimal scan ratio of any regular expression engine that scans the uncompressed file is 100%, i.e. every byte is scanned at least once. An engine that performs one full scan for the anchors and then a scan for regular expression tokens (like Snort), inspects all bytes once, in the case where not all string anchoress are matched, and more than once otherwise.

In regards with memory consumption, Let n be the size of the dictionary, k be the size of the Matched list, and p the number of bits required to represent a pointer in the system. The memory consumption of our algorithm is np+2 kp, where the first term is for holding the values of the elements in State array, and the second term is for the Matched list (each of its k element holds a pointer to the dictionary and a pointer to the patterns).

By way of example, searching for Snort patterns on google.com dictionary yields a Matched list of size approximately 40000 (matches of patterns of length 1 were ignored as they can be dealt separately). In the given input, embodiments of the present invention need no more than 17 bits to address either a byte in a dictionary or a state in the DFA, therefore the memory consumption is 3457000 bits=420 KB for n=116 KB. This memory consumption can be further reduced using a variable-length pointer encoding.

Advantageously, embodiments of the present invention provide pattern matching algorithm on shared dictionary compressed traffic, which scans 99% of the bytes only once: around 56% of these bytes are scanned in an offline phase, implying that it gain up to 56% improvement in the performance over multi-patterns matching algorithm that scans the plain-text. In addition, our algorithm has low memory consumption (around 420 KB for today's dictionary).

Advantageously, embodiments of the present invention can run on two different environments. First, it can run within a security tool that performs DPI and therefore has to be deployed with a pattern matching algorithm. In addition, it can run in a single user environment, such as PC, tablet or cellular phone. The performance of all these tools is dominated by the speed of their string-matching algorithms, therefore our algorithm provides a real improvement when dealing with SDCH-compressed traffic. In addition, due to its low memory footprint, the algorithm can be easily deployed in nowadays environments.

As will be appreciated by one skilled in the art, aspects of the present invention may be embodied as a system, method or an apparatus. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The aforementioned flowchart and block diagrams illustrate the architecture, functionality, and operation of possible implementations of systems and methods according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the above description, an embodiment is an example or implementation of the inventions. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions.

It is to be understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Methods of the present invention may be implemented by performing or completing manually, automatically, or a combination thereof, selected steps or tasks.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs.

The descriptions, examples, methods and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention may be implemented in the testing or practice with methods and materials equivalent or similar to those described herein.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A method comprising:
obtaining a dictionary file comprising a string of symbols, each symbol associated with a respective index;
obtaining at least one delta file associated with said dictionary file, wherein said delta file comprises a sequence of instructions that include at least one copy instruction pointing to an index within said dictionary and a length of a copy substring to be copied;
scanning said dictionary using a pattern matching algorithm associated with a plurality of patterns and implemented as a Deterministic Finite Automaton (DFA), to yield DFA execution data;
scanning said at least one delta file, using said pattern matching algorithm, wherein said DFA execution data is used to skip at least part of the scanning of the copy substrings for at least one of the copy instructions, wherein when encountering a copy instruction which copies the symbols $b_p, \ldots, b_{p+x-1}$ from the dictionary:

scanning the copied symbols from the dictionary one by one, until when scanning a symbol $b_{p+i}$, a state in the DFA is reached whose depth is less or equal to i, wherein in a case that the end of the copied data is reached before encountering said state, the next instruction on the delta file is applied as if all the copied symbol were scanned;

otherwise, checking to find any patterns in the dictionary that ends within interval [x, x+p), and in a case said patterns are found, checking by their length that said patterns are fully contained within that interval; and obtaining the state in the DFA that corresponds to the last copied symbol.

2. The method according to claim 1, wherein the dictionary file is a shared dictionary used in compressed Internet traffic.

3. The method according to claim 1, wherein the dictionary file and at least one delta file are associated with Shared Dictionary Compression over Hypertext Transfer Protocol (HTTP) (SDCH).

4. The method according to claim 1, wherein at least some of the scanned patterns include security hazards in Internet traffic.

5. The method according to claim 1, wherein the pattern matching algorithm is Aho-Corasick.

6. The method according to claim 1, wherein said scanning said dictionary is wherein said scanning of said dictionary is carried out at a pre-processing stage and wherein said scanning said at least one delta file is carried out at a processing stage following said pre-processing stage.

7. The method according to claim 1, wherein said patterns occurrence data comprises an indication for each symbol in said dictionary as to at which state of the pattern matching algorithm said symbol was scanned, indices of the symbols pointing to a matched pattern, and a corresponding state at which said pattern was found.

8. The method according to claim 4, wherein the security hazard comprises a word signature.

9. A system comprising:
a plurality of network devices; and
a communication network interconnecting said network devices,
wherein at least one of said network devices comprises a coprocessor executing a set of instructions implementing a method comprising:
(a) obtaining a dictionary file comprising a string of symbols, each symbol associated with a respective index;
(b) obtaining at least one delta file associated with said dictionary file, wherein said delta file comprises a sequence of instructions that include at least one copy instruction pointing to an index within said dictionary and a length of a copy substring to be copied;
(c) scanning said dictionary using a pattern matching algorithm associated with a plurality of patterns and implemented as a Deterministic Finite Automaton (DFA), to yield DFA execution data; and
(d) scanning said at least one delta file, using said pattern matching algorithm, wherein said DFA execution data is used to skip at least part of the scanning of the copy substrings for at least some of the copy instructions,
wherein when encountering a copy instruction which copies the symbols $b_p, \ldots, b_{p+x-1}$ from the dictionary:

scanning the copied symbols from the dictionary one by one, until when scanning a symbol $b_{p+i}$, a state in the DFA is reached whose depth is less or equal to i, wherein in a case that the end of the copied data is reached before encountering said state, the next instruction on the delta file is applied as if all the copied symbol were scanned;

otherwise, checking to find any patterns in the dictionary that ends within interval [x, x+p), and in a case said patterns are found, checking by their length that said patterns are fully contained within that interval; and obtaining the state in the DFA that corresponds to the last copied symbol.

10. The system according to claim 9, wherein the dictionary file is a shared dictionary used in compressed Internet traffic.

11. The system according to claim 9, wherein the dictionary file and the at least one delta file are associated with Shared Dictionary Compression over Hypertext Transfer Protocol (HTTP) (SDCH).

12. The system according to claim 9, wherein at least some of the scanned patterns include security hazards in Internet traffic.

13. The system according to claim 9, wherein the pattern matching algorithm is Aho-Corasick.

14. The system according to claim 9, wherein said scanning of said dictionary is carried out at a pre-processing stage and wherein said scanning said at least one delta file is carried out at a processing stage following said pre-processing stage.

15. The system according to claim 9, wherein said patterns occurrence data comprises an indication for each symbol in said dictionary as to at which state of the pattern matching algorithm said symbol was scanned, indices of the symbols pointing to a matched pattern, and a corresponding state at which said pattern was found.

16. The system according to claim 12, wherein the security hazard comprises a word signature.

17. A computer program product comprising: a non-transitory computer readable storage medium having computer readable program embodied therewith, the computer readable program comprising:
computer readable program configured to obtain a dictionary file comprising a string of symbols, each symbol associated with a respective index;
computer readable program configured to obtain at least one delta file associated with said dictionary file, wherein said delta file comprises a sequence of instructions that include at least one copy instruction pointing to an index within said dictionary and a length of a copy substring to be copied;
computer readable program configured to scan said dictionary using a pattern matching algorithm associated with a plurality of patterns and implemented as a Deterministic Finite Automaton (DFA), to yield DFA execution data; and
computer readable program configured to scan said at least one delta file, using said pattern matching algorithm, wherein said DFA execution data is used to skip at least part of the scanning of the copy substrings for at least one of the copy instructions,
wherein when encountering a copy instruction which copies the symbols $b_p, \ldots, b_{p+x-1}$ from the dictionary:

scanning the copied symbols from the dictionary one by one, until when scanning a symbol $b_{p+i}$, a state in the DFA is reached whose depth is less or equal to i, wherein in a case that the end of the copied data is reached before encountering said state, the next instruction on the delta file is applied as if all the copied symbol were scanned;

otherwise, checking to find any patterns in the dictionary that ends within interval [x, x+p), and in a case said patterns are found, checking by their length that said patterns are fully contained within that interval; and obtaining the state in the DFA that corresponds to the last copied symbol.

18. The computer program product according to claim 17, wherein the dictionary file is a shared dictionary used in compressed Internet traffic.

19. The computer program product according to claim 17, wherein the dictionary file and the at least one delta file are associated with Shared Dictionary Compression over Hypertext Transfer Protocol (HTTP) (SDCH).

20. The computer program product according to claim 17, wherein at least some of the scanned patterns include security hazards in Internet traffic.

21. The computer program product according to claim 17, wherein the pattern matching algorithm is Aho-Corasick.

22. The computer program product according to claim 17, wherein said scanning said dictionary is carried out off-line and wherein said scanning said at least one delta file is carried out on-line.

23. The computer program product according to claim 17, wherein said patterns occurrence data comprises an indication for each symbol in said dictionary as to at which state of the pattern matching algorithm said symbol was scanned, indices of the symbols pointing to a matched pattern, and a corresponding state at which said pattern was found.

24. The computer program product according to claim 20, wherein the security hazard comprises a word signature.

* * * * *